(12) United States Patent
Lu et al.

(10) Patent No.: US 9,874,763 B2
(45) Date of Patent: Jan. 23, 2018

(54) 2D/3D SWITCHABLE DISPLAY PANEL, AND DISPLAY METHOD AND DISPLAY DEVICE THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengcheng Lu, Beijing (CN); Xue Dong, Beijing (CN); Xiaochuan Chen, Beijing (CN); Ming Yang, Beijing (CN); Qian Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/106,191

(22) PCT Filed: Sep. 10, 2015

(86) PCT No.: PCT/CN2015/089337
§ 371 (c)(1),
(2) Date: Jun. 17, 2016

(87) PCT Pub. No.: WO2016/187984
PCT Pub. Date: Dec. 1, 2016

(65) Prior Publication Data
US 2017/0139218 A1    May 18, 2017

(30) Foreign Application Priority Data
May 25, 2015  (CN) .......................... 2015 1 0272141

(51) Int. Cl.
*G02B 27/22*    (2006.01)
*G02F 1/1335*   (2006.01)
(Continued)

(52) U.S. Cl.
CPC ... *G02B 27/2214* (2013.01); *G02F 1/133514* (2013.01); *G02F 1/133526* (2013.01);
(Continued)

(58) Field of Classification Search
CPC .................................................. G02B 27/2214
See application file for complete search history.

(56) References Cited

U.S. PATENT DOCUMENTS

| | | | | |
|---|---|---|---|---|
| 5,969,850 A | * | 10/1999 | Harrold | G02B 27/2214 348/E13.004 |
| 2006/0146208 A1 | * | 7/2006 | Kim | G02B 27/2214 349/15 |

(Continued)

FOREIGN PATENT DOCUMENTS

| | | |
|---|---|---|
| CN | 101713868 A | 5/2010 |
| CN | 102096222 A | 6/2011 |

(Continued)

OTHER PUBLICATIONS

First Chinese Office Action, for Chinese Patent Application No. 201510272141.3, dated Sep. 9, 2016, 12 pages.
(Continued)

*Primary Examiner* — Sang V Nguyen
(74) *Attorney, Agent, or Firm* — Kinney & Lange, P.A.

(57) ABSTRACT

The embodiment of the present application discloses a 2D/3D switchable display panel, and a display method and a display device thereof, so as to solve the problem of poor display effect in 2D display mode of existing 2D/3D display panel. The 2D/3D switchable display panel includes a self-luminescent OLED display panel and a LCD panel provided (Continued)

with no color resistance layer, which LCD display panel is disposed on the display side of the OLED display panel. The OLED display panel is used for display images when the 2D/3D switchable display panel operates in 3D display mode while functions as a backlight source module when the 2D/3D switchable display panel operates in 2D display mode; whereas the LCD display panel functions as a grating when the 2D/3D switchable display panel operates in 3D display mode while displays images when the 2D/3D switchable display panel operates in 2D display mode.

13 Claims, 6 Drawing Sheets

(51) Int. Cl.
G09G 3/34 (2006.01)
G09G 3/36 (2006.01)
H01L 27/32 (2006.01)

(52) U.S. Cl.
CPC .. *G02F 1/133528* (2013.01); *G02F 1/133603* (2013.01); *G09G 3/3413* (2013.01); *G09G 3/3607* (2013.01); *H01L 27/3232* (2013.01); *G02F 2001/133626* (2013.01); *G02F 2202/28* (2013.01); *G02F 2203/62* (2013.01)

(56) References Cited

U.S. PATENT DOCUMENTS

| | | | | |
|---|---|---|---|---|
| 2009/0135108 A1* | 5/2009 | Lindfors | ............... | G09G 3/3426 345/76 |
| 2011/0157169 A1* | 6/2011 | Bennett | ............... | G06F 3/14 345/419 |
| 2012/0001956 A1* | 1/2012 | Sato | ............... | H04N 13/0409 345/690 |
| 2012/0013651 A1* | 1/2012 | Trayner | ............... | G02B 5/32 345/690 |
| 2012/0038854 A1* | 2/2012 | Inoue | ............... | G02B 27/2214 349/96 |
| 2013/0057789 A1* | 3/2013 | An | ............... | G02B 27/2214 349/15 |
| 2013/0176299 A1* | 7/2013 | Hamagishi | ............... | G06T 15/00 345/419 |
| 2014/0043578 A1* | 2/2014 | Lin | ............... | G02F 1/1339 349/153 |
| 2014/0362314 A1* | 12/2014 | Guo | ............... | G02B 27/2214 349/15 |
| 2015/0130751 A1* | 5/2015 | Teraguchi | ............... | G02F 1/13338 345/174 |
| 2015/0381971 A1* | 12/2015 | Wu | ............... | G02B 27/2214 348/54 |
| 2016/0065950 A1* | 3/2016 | Quan | ............... | G09G 3/36 348/51 |
| 2017/0155891 A1* | 6/2017 | Hu | ............... | H04N 13/0404 |

FOREIGN PATENT DOCUMENTS

| | | |
|---|---|---|
| CN | 102314018 A | 1/2012 |
| CN | 202711607 U | 1/2013 |
| CN | 103048835 A | 4/2013 |
| CN | 103197474 A | 7/2013 |
| CN | 103293726 A | 9/2013 |
| CN | 203385938 U | 1/2014 |
| CN | 103824876 A | 5/2014 |
| CN | 104020572 A | 9/2014 |
| CN | 104299575 A | 1/2015 |
| CN | 204101856 U | 1/2015 |
| CN | 104345466 A | 2/2015 |
| CN | 104834104 A | 8/2015 |
| WO | WO2008105584 A1 | 9/2008 |

OTHER PUBLICATIONS

Second Chinese Office Action, for Chinese Patent Application No.: 2015102721413, dated Dec. 16, 2016, 14 pages.
International Search Report and Written Opinion from PCT Application Serial No. PCT/CN2015/089337, dated Feb. 14, 2016, 11 pages.

* cited by examiner

2D/3D SWITCHABLE DISPLAY PANEL, AND DISPLAY METHOD AND DISPLAY DEVICE THEREOF

CROSS-REFERENCE TO RELATED APPLICATION

The present application claims the benefit of Chinese Patent Application No. 201510272141.3 filed on May 25, 2015 in the State Intellectual Property Office of China, the whole disclosure of which is incorporated herein by reference.

BACKGROUND OF THE INVENTION

Field of the Invention

Embodiments of the present application relate to the technical field of display technology, and in particular, to a two dimensional (2D)/three dimensional (3D) switchable display panel, and a display method and a display device thereof.

Description of the Related Art

There are a variety of ways for implementing naked-eye 3D display, comprising optical barrier type 3D technology, which is also known as parallax barrier technology. An optical barrier type 3D product is compatible with processes of existing LCD (Liquid Crystal Display) panel, i.e., which is achieved by further modifying an existing LCD panel as a liquid crystal grating, to be specific, by forming stripe-shaped electrode strips on both upper and lower substrates of the LCD panel, with a working principle being in that, upon implementing 3D display, the liquid crystal grating is electrified; and since liquid crystal molecules between the stripe-shaped electrode strips on the upper and lower substrates are twisted, then light is inhibited from passing therethrough completely, such that light and shade staggered strips which are arranged alternately are formed by the liquid crystal grating. Then, when left-eye images and right-eye images displayed are observed by respective left and right eyes of the viewer, respectively, stereoscopic 3D images are formed by the overlap effect of left-eye images and right-eye images in the brain of the viewer.

In existing optical barrier type 3D products, a backlight source module should be additionally provided to the LCD panel therein, resulting in larger thickness thereof. In the prior art, some previous LCD panels with backlight source modules are replaced by alternative novel OLED (Organic Light Emitting Diode) display panels which are self-luminescent, in each of which the OLED display panel is combined and cooperating with a grating so as to implement an optical barrier type 3D product with smaller thickness. However, in the combination therebetween, even if it is possible that the entire thickness of the optical barrier type 3D product is reduced, 2D display effect thus created is still not good enough due to the fact that the image sampling rate by PPI (Pixels Per Inch) of the OLED display panel is lower than that of the LCD panel when the optical barrier type 3D product is operated in a 2D/3D display mode.

SUMMARY OF THE INVENTION

The present application has been made to overcome or alleviate at least one aspect of the above mentioned disadvantages and/or shortcomings. One main object of the exemplary embodiment of the present application is to provide a two dimensional (2D)/three dimensional (3D) switchable display panel, and a display method and a display device thereof, so as to solve the problem that a poor display effect is caused when the 2D/3D switchable display panel is operated in a 2D display mode.

The exemplary embodiment of the present application is accomplished through the following technical solution:

According to an aspect of the exemplary embodiment of the present application, there is provided a 2D/3D switchable display panel, comprising an OLED display panel which is self-luminescent, and a LCD panel which is provided with no color resistance layer and disposed on a display side of the OLED display panel, wherein the OLED display panel is configured to display an image when the 2D/3D switchable display panel operates in a 3D display mode, and to act as a backlight source module when the 2D/3D switchable display panel operates in a 2D display mode; and the LCD display panel is configured to act as a grating when the 2D/3D switchable display panel operates in the 3D display mode, and to display an image when the 2D/3D switchable display panel operates in the 2D display mode.

In this exemplary embodiment, an OLED display panel which is self-luminescent is combined with a LCD panel which is provided with no color resistance layer, such that the OLED display panel displays images in the 3D display mode while the LCD panel displays images in the 2D display mode to ensure not only smaller thickness but also better display effect in the 2D display mode, of the 2D/3D switchable display panel.

According to an exemplary embodiment of the present application, the LCD panel comprises a color filter substrate, an array substrate and a liquid crystal layer provided between the color filter substrate and the array substrate, the color filter substrate and the array substrate and the liquid crystal layer being disposed to be cell aligned; and the array substrate is provided with a pixel unit array for displaying images.

According to another exemplary embodiment of the present application, the array substrate of the LCD panel is provided with a lower polarizer sheet at a side thereof facing away from the liquid crystal layer; and the color filter substrate of the LCD panel is provided with an upper polarizer sheet at a side thereof facing away from the liquid crystal layer. In this exemplary embodiment, the LCD panel functions not only as a grating but also as a display main body for 2D display.

According to another exemplary embodiment of the present application, the LCD panel further comprises a lenticular lens layer arranged at a side, facing away from the liquid crystal layer, of the color filter substrate. In this exemplary embodiment, micro lenticular lens 3D display may be implemented by the lenticular lens layer, while the LCD panel operates as a display main body for 2D display.

According to another exemplary embodiment of the present application, an area of a region corresponding to each pixel on the OLED display panel is not only larger than but also an integral multiple of an area of a region corresponding to each pixel on the LCD panel.

According to another exemplary embodiment of the present application, a highest refresh rate of the OLED display panel is at least three times of a lowest refresh rate of the LCD panel.

According to another exemplary embodiment of the present application, the OLED display panel comprises a display substrate and a packaging cover plate; and an adhesive portion is interposed between the LCD panel and the OLED display panel, and the array substrate of the LCD panel is adhered to the cover plate by the adhesive portion.

According to another exemplary embodiment of the present application, the OLED display panel only comprises a display substrate and a display component arranged on the display substrate, the display substrate defining a display zone around which an adhesive portion is provided at a periphery of the display substrate of the OLED display panel; and the array substrate of the LCD panel is adhered to the display substrate of the OLED display panel by means of the adhesive portion. In this exemplary embodiment, the OLED display panel only comprises a display substrate such that the light emission of the OLED component on the display substrate is closer to the LCD panel, i.e., with a smaller distance therebetween, in other words, smaller placement height, which contributes to implementing 3D image display with higher PPI and decreasing the thickness of the 2D/3D switchable display panel.

According to another aspect of the exemplary embodiment of the present application, there is provided a 2D/3D switchable display device, comprising the aforementioned 2D/3D switchable display panel. In this exemplary embodiment, a superior beneficial technical effect is provided in that an OLED display panel which is self-luminescent is combined with a LCD panel which is provided with no color resistance layer, such that the OLED display panel displays images in the 3D display mode while the LCD panel displays images in the 2D display mode to ensure not only smaller thickness but also better display effect in the 2D display mode, of the 2D/3D switchable display panel.

According to still another aspect of the exemplary embodiment of the present application, there is provided a display method for the aforementioned 2D/3D switchable display panel, comprising steps of: operating the 2D/3D switchable display panel in the 3D display mode by configuring the OLED display panel to display an image thereon and configuring the LCD panel to act as a grating; and the 2D/3D switchable display panel in the 2D display mode by configuring the LCD panel to display an image thereon and configuring the OLED display panel to act as a backlight source module.

According to another exemplary embodiment of the present application, the step of operating the 2D/3D switchable display panel in the 3D display mode by configuring the OLED display panel to display an image thereon and configuring the LCD panel to act as a grating comprises steps of: configuring the OLED display panel to display an image thereon; and configuring the LCD panel to display in a grating displaying mode and forming both a left-eye image and a right-eye image by passing the image displayed by the OLED display panel through the LCD panel such that the 2D/3D switchable display panel is operated in the 3D display mode.

According to another exemplary embodiment of the present application, the LCD panel comprises a lenticular lens layer arranged at a side, facing away from the liquid crystal layer, of the color filter substrate, and the step of operating the 2D/3D switchable display panel in the 3D display mode by configuring the OLED display panel to display an image thereon and configuring the LCD panel to act as a grating comprises steps of: configuring the OLED display panel to display an image thereon; and configuring the LCD panel to cooperate with the lenticular lens layer to display and forming both a left-eye image and a right-eye image by passing the image displayed by the OLED display panel through both of the LCD panel and the lenticular lens layer such that the 2D/3D switchable display panel is operated in the 3D display mode.

According to another exemplary embodiment of the present application, the step of operating the 2D/3D switchable display panel in the 2D display mode by configuring the LCD panel to display an image thereon and configuring the OLED display panel to act as a backlight source module comprises steps of: setting a refresh rate of the OLED display panel to be at least three times of a refresh rate of the LCD panel, and emitting, by the OLED display panel, R, G, B color lights that are used as backlight for the LCD panel in different time periods respectively within a display duration of a frame of image, an emission duration for each of the R, G, B color lights corresponding to a refreshment duration of the LCD panel; and adjusting deflection angles of all portions of the liquid crystal layer of the LCD display panel corresponding to regions where the pixels are located respectively, on the basis of gray-scales of the R, G, B colors to be displayed by the pixels within corresponding emission durations, so as to change respective transmittances of the regions where the pixels are located to accommodate respective gray-scales and to display respective one of the R, G, B colors.

In this exemplary embodiment, a superior beneficial technical effect is provided in that an OLED display panel which is self-luminescent is combined with a LCD panel which is provided with no color resistance layer, such that the OLED display panel displays images in the 3D display mode while the LCD panel displays images in the 2D display mode to ensure not only smaller thickness but also better display effect in the 2D display mode, of the 2D/3D switchable display panel.

BRIEF DESCRIPTION OF THE DRAWINGS

The above and other features and advantages of the present application will become more apparent and a more comprehensive understanding of the present application can be obtained, by describing in detail exemplary embodiments thereof with reference to the accompanying drawings, in which.

DETAILED DESCRIPTION OF PREFERRED EMBODIMENTS OF THE INVENTION

Figure 1:
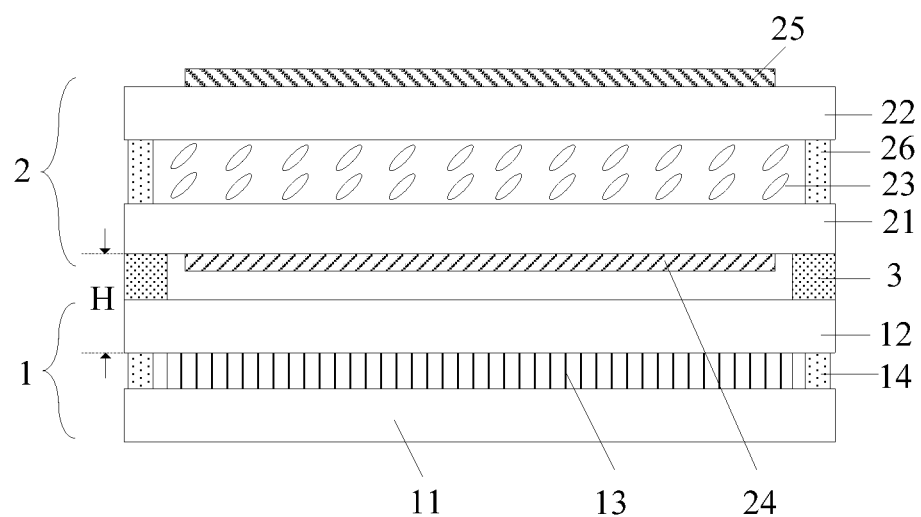
FIG. 1 illustrates a schematic cross sectional view of a first 2D/3D switchable display panel provided by an exemplary embodiment of the invention.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the application in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective thickness and shape of each optical element in the drawings are only intended to exemplarily illustrate the contents of the disclosure, rather than to demonstrate the practical dimension or proportion of components of the 2D/3D switchable display panel.

According to a general technical concept of the present application, as illustrated in FIG. 1, there is provided a 2D/3D switchable display panel, comprising an OLED display panel 1 which is self-luminescent, and a LCD panel 2 which is provided with no color resistance layer and disposed on the display side of the OLED display panel 1; the OLED display panel is used for displaying images when the 2D/3D switchable display panel operates in a 3D display mode, and functions as a backlight source module for projecting lights onto the LCD panel when the 2D/3D switchable display panel operates in a 2D display mode; and wherein the LCD display panel functions as a grating when the 2D/3D switchable display panel operates in the 3D display mode, and displays images by means of the lights projected from the OLED display panel when the 2D/3D switchable display panel operates in the 2D display mode.

As illustrated in FIG. 1, in this exemplary embodiment of the invention, By means of the combination between the self-luminescent OLED display panel 1 and the LCD panel 2 which is provided with no color resistance layer, the OLED display panel 1 displays images in the 3D display mode, and the LCD panel 2 functions as a grating type functional panel which forms both left-eye and right-eye images respectively by exploiting the operational principle of light-splitting, and the LCD panel 2 displays images in the 2D display mode while the OLED display panel 1 functions as a backlight source module for providing backlight therefrom. Therefore, the LCD display panel 2 is still used to display images with higher PPI in the 2D display mode while the 2D/3D switchable display panel is ensured to have smaller thickness, such that better display effect may in turn be obtained in the 2D display mode.

Meanwhile, since the 2D/3D switchable display panel is not provided with specific purpose backlight source module, the light emitted from the OLED display panel 1 is provided at a relatively small distance (i.e., placement height H) from the LCD panel 2; thereby, the OLED display panel 1 displays images while the LCD panel 2 functions as a grating such that 3D image display with high quality may be realized. Furthermore, on the basis of the characteristics of the self-luminescent structure and low power consumption of the OLED display panel 1, it is thus not necessary to provide individually a specific purpose backlight source module, such that a decreased thickness and a reduced power consumption of the 2D/3D switchable display panel may be obtained.

The LCD panel 2, for example, comprises an array substrate 21, a color filter substrate 22, and a liquid crystal layer 23. The array substrate 21 and the color filter substrate 22 are typically disposed to be cell-aligned and are boned together at their respective edges by a first frame sealant 26 in a sealing manner, and the liquid crystal layer 23 is interposed between the array substrate 21 and the color filter substrate 22, wherein the color filter substrate 22 is not provided with a color resistance layer. In other words, the LCD panel 2 may not be restricted by any color resistance layer, such that an effect of grating display may be implemented; besides, it is also possible that, on the basis of the R, G, B color lights emitted from the OLED display panel 1, display of colors can may be implemented by the adjustment of deflection angles of liquid crystal molecules in the liquid crystal layer.

In an exemplary embodiment of the invention, a lower polarizer sheet 24 is arranged at a side, facing away from the liquid crystal layer 23, of the array substrate 21 of the LCD panel 2; and an upper polarizer sheet 25 is arranged at a side, facing away from the liquid crystal layer 23, of the color filter substrate 22 of the LCD panel 2. In this embodiment, the LCD panel 2 functions not only as a grating for 3D display, but also as a display main body for 2D display, for facilitating not only the 3D display mode with optical barrier type 3D technology, and the 2D display mode, respectively, but also switchover of display modes therebetween as desired.

Certainly, with the concept and the spirit of the invention, the 2D/3D switchable display panel as illustrated in FIG. 1 may also be modified and/or varied, so as to apply for both 3D display mode with micro lenticular lens type 3D display technology and normal 2D display mode. By way of example, referring to FIG. 2 (the reference numerals therein with identical meaning to those in FIG. 1), a lenticular lens layer 27 is arranged at a side, facing away from the liquid crystal layer 23, of the color filter substrate 22, such that the LCD panel 2 is essentially a transparent display screen in the 3D display mode, and alternatively, the images displayed by the OLED display panel 1 are to be transformed to both left-eye and right-eye images for the corresponding viewer, by the lenticular lens layer 27. In this exemplary embodiment, micro lenticular lens 3D display may be implemented by the lenticular lens layer 27 arranged on the LCD panel 2, while the LCD panel 2 operates as a display main body for 2D display, for facilitating not only the 3D display mode with micro lenticular lens type 3D technology, and the normal 2D display mode, respectively, but also switchover of display modes therebetween as desired.

It should be noticed that, the LCD panel 2 also has display function. Therefore, a pixel unit array (not illustrated here) is provided on the array substrate 21, e.g., for displaying images thereon, for example, with each pixel unit comprising components such as thin film transistor(s), pixel electrode(s), common electrode(s), and so on. Certainly, on the array substrate 21 there should also be data line(s), gate line(s) and common electrode line(s), etc, which need not be repeatedly described in details one by one here.

Figure 2:
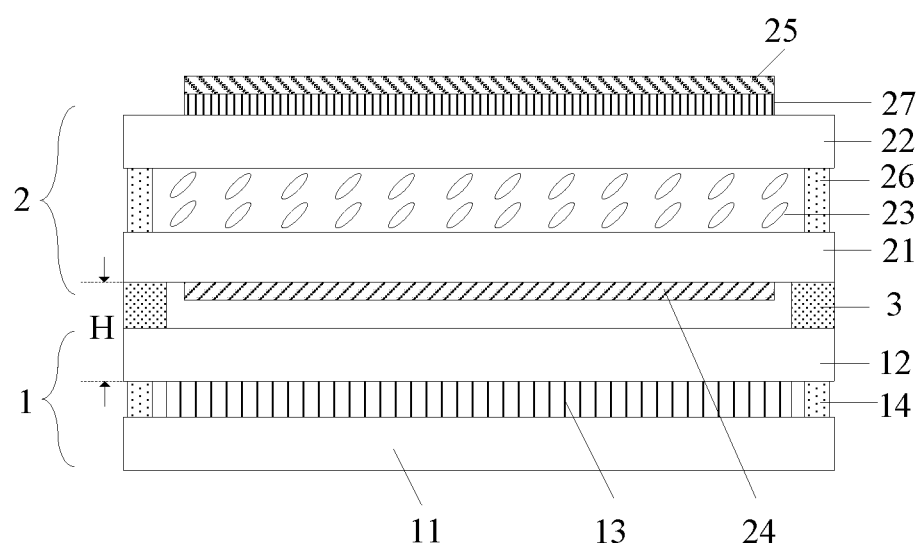
FIG. 2 illustrates a schematic cross sectional view of a second 2D/3D switchable display panel provided by another exemplary embodiment of the invention.

By way of example, in the 2D/3D switchable display panel as illustrated in both FIGS. 1 and 2, the OLED display panel 1 comprises a display substrate 11 and a packaging cover plate 12; and an adhesive portion 3 is interposed between the LCD panel and the OLED display panel, especially at their respective edges, and the array substrate 21 of the LCD panel 2 is adhered to the packaging cover plate 12 by the adhesive portion 3. Certainly, the OLED display panel 1 may also comprises any other necessary layer structures, elements or components, for example, a display component 13 formed on the display substrate 11; and in another example, a second frame sealant 14 adhered between the display substrate 11 and the packaging cover plate 12 at their respective edges in a sealing manner; and any other corresponding layer structure, elements and components of the OLED display panel 1 which may also be provided as required on the basis of the exemplary embodiments of the invention, which need not be repeatedly described in details one by one here.

Figure 3:
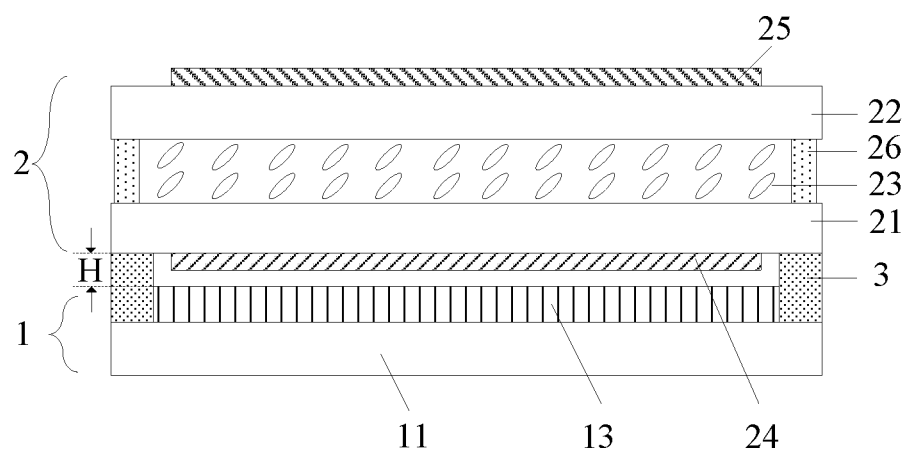
FIG. 3 illustrates a schematic cross sectional view of a third 2D/3D switchable display panel provided by yet another exemplary embodiment of the invention.

In order to make the thickness of the 2D/3D switchable display panel even smaller, it is possible that the placement height H, i.e., the distance between an upper surface of the light-emitting display component 13 of the OLED display panel 1 and a lower surface of the LCD panel 2, is reduced, wherein the height H, as illustrated in both FIGS. 1 and 2, equals to a sum of both the thickness of the cover plate 12 and that of the adhesive portion 3, such that the 2D/3D switchable display panel as illustrated in FIG. 1 is optimized, e.g., by optimizing the OLED display panel 1. As further illustrated in FIG. 3, the OLED display panel 1 itself only comprises a display substrate 11 and a display component 13 arranged thereon, the display component 13 defining a display zone around which an adhesive portion 3 is provided at the periphery of the display substrate 11 of the OLED display panel 1; and the array substrate 21 of the LCD panel 2 is overlapped onto the display substrate 11 of the OLED display panel 1 by means of the adhesive portion 3 in a adhesion manner. In this exemplary embodiment, the OLED display panel 1 only comprises a display substrate 11 and a display component 13 thereon which is surrounded by the adhesive portion 3 at the periphery thereof, without a packaging cover plate thereon, and the placement height H as illustrated in the embodiment of FIG. 3 only equals to the entire thickness of the whole adhesive portion 3, resulting in smaller distance between the light-emitting display component 13 on the display substrate 11 and the LCD panel 2 (i.e., placement height H is decreased), which contributes to implementing 3D image display with high quality while decreasing the thickness of the 2D/3D switchable display panel.

In an exemplary embodiment of the invention, the LCD panel 2 may implement display of colors on the basis of the R, G, B color lights emitted from the OLED display panel 1, by adjusting the deflection angles of liquid crystal molecules in the liquid crystal layer. In order to obtain better display effect, in an exemplary embodiment of the invention, an area of a corresponding region of each pixel on the OLED display panel is not only larger than but also an integral multiple of an area of a corresponding region of each pixel on the LCD panel 2. Moreover, a highest refresh rate of the OLED display panel is at least three times of the lowest refresh rate of the LCD panel 2. For facilitating easy understanding thereof, specific depictions are set forth as below, in view of FIGS. 4 and 5.

Figure 4:
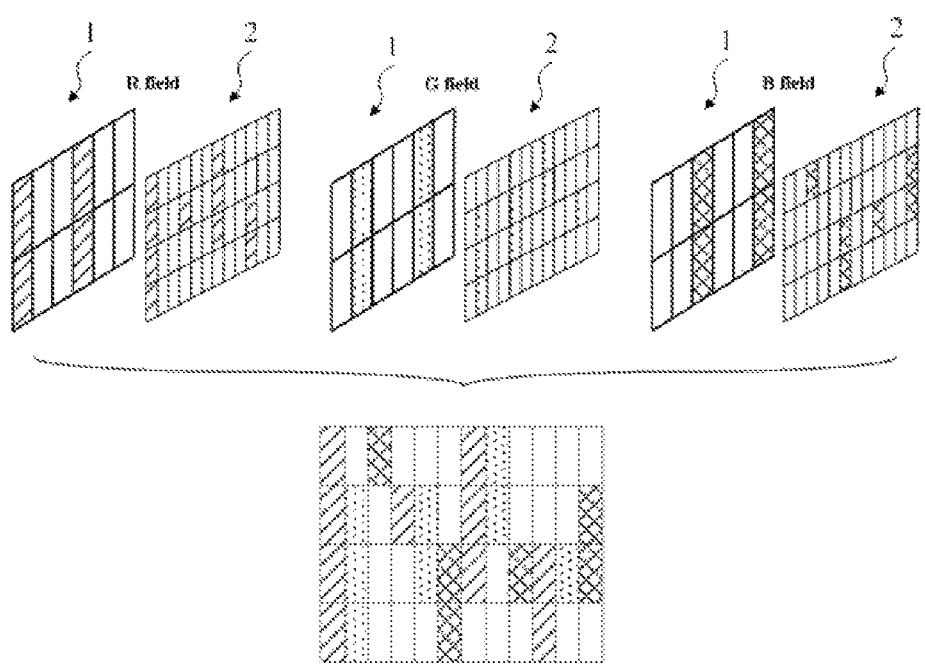
FIG. 4 is a schematic view of a 2D display mode provided by an exemplary embodiment of the invention.

Referring to FIG. 4, in the 2D display mode, OLED display panel 1 is self-luminescent, and an area of a corresponding region of each pixel on the OLED display panel is 4 times of an area of a corresponding region of each pixel on the LCD panel, wherein the specific value of "4 times" only intends for facilitating more convenient depiction, the embodiments of the invention being not limited or confined thereto, i.e., the specific multiple value may also be chosen as any integer larger than one, e.g., two, three, or five, or any other bigger integer. It is also conceivable that the PPI of the LCD panel 2 is an integral multiple, larger than one, of that of the OLED display panel 1.

By way of example, the refresh rate of the OLED display panel 1 is chosen as 180 Hz while the refresh rate of the LCD panel 2 is chosen as 60 Hz. Then, within a display duration of a frame of 2D image by the LCD panel 2, the OLED display panel 1 displays, e.g., in three individual fields sequentially, i.e., R field, G filed and B field, at different time period. As illustrated, within a R-field display time of the OLED display panel 1 corresponding to a frame of 2D image, all the R pixels are displayed on the OLED, and the emitted R color lights are uniformly passed to the LCD panel 2 after light mixing, then each pixel on the LCD panel 2 displays respective R color with desired gray scale value, by regulating the deflection angles of liquid crystal molecules in the liquid crystal layer 23 to obtain desired transmittances of R color, as a function of the gray scale of the R color to be displayed within the pixel by the frame of 2D image. Similarly, within a G field and a B field display times of the OLED display panel 1 corresponding to a frame of 2D image, the respective G field and B field of the OLED display panel 1 display on the basis of above principle respectively. Hereby, the frame of 2D image is displayed completely. It should also be noticed that, according to the design requirements for both the OLED display panel 1 and the LCD panel 2, it is possible that the display sequences of R field, G field and B field of the OLED display panel 1 are adjusted, not being limited or confined thereto.

Figure 5:
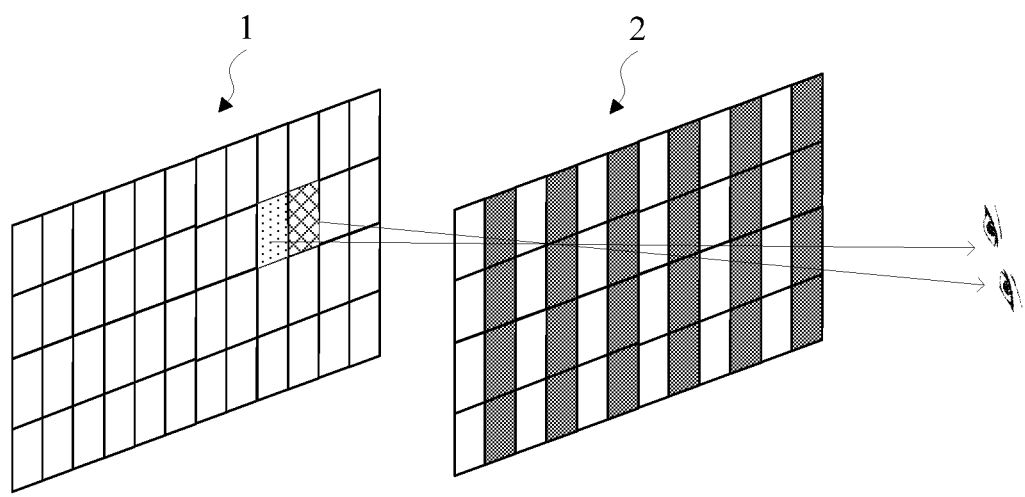
FIG. 5 is a schematic view of a 3D display mode provided by another exemplary embodiment of the invention.

Further referring to FIG. 5, in the 3D display mode, the OLED display panel 1 functions as the display main body while the LCD panel 2 operates as a grating, such that a 3D image with certain parallax is passed through the grating formed by the LCD panel 2 and thus processed by the operational principle of light-splitting of the grating, and projected onto both left and right eyes of the viewer, so as to form naked-eye 3D display effect. The distance between the light emitted from the OLED display panel 1 and the LCD panel 2, i.e., the placement height H, is relatively small, thus facilitating the display of 3D image with high quality.

It should also be noticed that, when the LCD panel 2 functions as a grating, such a grating may be flexibly formed as prescribed, so as to meet the display requirement of the OLED display panel 1.

In this exemplary embodiment, a superior beneficial technical effect is provided in that, by means of the combination between the self-luminescent OLED display panel 1 and the LCD panel 2 which is provided with no color resistance layer, the OLED display panel 1 displays images in the 3D display mode while the LCD panel 2 functions as a light-splitting grating type functional panel for forming both left-eye and right-eye images respectively, and the LCD panel 2 displays images in the 2D display mode while the OLED display panel 1 functions as a backlight source module for providing backlight therefrom. In other words, in the 2D display mode, the LCD panel 2 is still used for displaying images with high PPI, thereby better display effect may still be obtained in the 2D display mode. Meanwhile, since the 2D/3D switchable display panel is not provided with specific purpose backlight source module, the light emitted from the OLED display panel 1 is provided at a relatively small distance from the LCD panel 2; thereby, the OLED display panel 1 displays images while the LCD panel 2 functions as a grating such that 3D image display with high quality may be realized. Furthermore, on the basis of the characteristics of the self-luminescent structure and low power consumption of the OLED display panel 1, it is thus not necessary to provide individually a specific purpose backlight source module, such that a decreased thickness and a reduced power consumption of the 2D/3D switchable display panel may be obtained.

In another aspect of the embodiments of the invention, there is also provided a 2D/3D switchable display device, comprising the aforementioned 2D/3D switchable display panel.

In this exemplary embodiment, a superior beneficial technical effect is provided in that, by means of the combination between the self-luminescent OLED display panel 1 and the LCD panel 2 which is provided with no color resistance layer, the OLED display panel 1 displays images in the 3D display mode while the LCD panel 2 functions as a light-splitting grating type functional panel for forming both left-eye and right-eye images respectively, and the LCD panel 2 displays images in the 2D display mode while the OLED display panel 1 functions as a backlight source module for providing backlight therefrom. In other words, in the 2D display mode, the LCD panel 2 is still used for displaying images with high PPI, thereby better display effect may still be obtained in the 2D display mode. Meanwhile, since the 2D/3D switchable display panel is not provided with specific purpose backlight source module, the light emitted from the OLED display panel 1 is provided at a relatively small distance from the LCD panel 2; thereby, the OLED display panel 1 displays images while the LCD panel 2 functions as a grating such that 3D image display with high quality may be realized. Furthermore, on the basis of the characteristics of the self-luminescent structure and low power consumption of the OLED display panel 1, it is thus not necessary to provide individually a specific purpose backlight source module, such that a decreased thickness and a reduced power consumption of the 2D/3D switchable display panel may be obtained.

Figure 6:
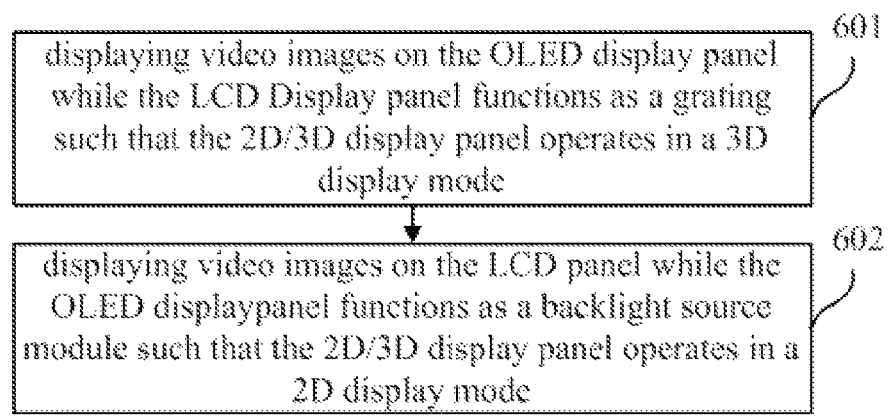
FIG. 6 illustrates a flow chart of a display method of the 2D/3D switchable display panel provided by an exemplary embodiment of the invention.

Referring to FIG. 6, In yet another aspect of the embodiments of the invention, there is further provided a display method for aforementioned 2D/3D switchable display panel, comprising:

In Step 601, OLED display panel displays images while the LCD panel functions as a grating, such that the 2D/3D switchable display panel is operated in the 3D display mode.

On the basis of different structures of the LCD panels as above, specific display ways are listed as below:

By way of example, LCD panels operates as a grating and the OLED display panel displays images, such that the 2D/3D switchable display panel operates in the 3D display mode, particularly comprising:
- displaying images on the OLED display panel; and
- operating the LCD panel in a grating displaying mode and passing the images displayed by the OLED display panel through the LCD panel to form both left-eye images and right-eye images simultaneously such that the 2D/3D switchable display panel operates in the 3D display mode.

Furthermore, in another exemplary embodiment, the LCD panel comprises a lenticular lens layer arranged at a side, facing away from the liquid crystal layer, of the color filter substrate, and the OLED display panel displays images while the LCD panel operates as a grating, such that the 2D/3D switchable display panel is operated in the 3D display mode, the display method specifically comprising:
- displaying images on the OLED display panel;
- operating the LCD panel in cooperation with the lenticular lens layer so as to further implement displaying on the LCD panel, and
- passing the images displayed by the OLED display panel through both of the LCD panel and the lenticular lens layer for light-splitting to form both left-eye images and right-eye images simultaneously such that the 2D/3D switchable display panel operates in the 3D display mode.

In Step 602, the OLED display panel operates as a backlight source module and the LCD panel displays images, such that the 2D/3D switchable display panel is operated in the 2D display mode.

In another exemplary embodiment of the invention, the OLED display panel is used as a backlight source module and the LCD panel displays images, such that the 2D/3D switchable display panel operates in the 2D display mode. The display method specifically comprising:
- setting a refresh rate of the OLED display panel as at least three times of the refresh rate of the LCD panel, and within a display duration of a frame of image, emitting R, G, B color lights as the backlight of the LCD panel by the OLED display panel during different time periods respectively, each of which color lights has a emission duration as a function of the refreshment duration of the LCD panel; and
- adjusting deflection angles of the liquid crystal layer corresponding to each region where each pixel is located, as a function of the gray scales of R, G, B colors to be displayed by each pixel within these emission durations, to change respective transmittances of the regions where the pixels are located to accommodate respective gray scales of each region, and to display respective one of the R, G, B colors on the LCD display panel.

The display method is performed, for example, in view of the schematic view of the 2D display mode as illustrated in FIG. 4 and the schematic view of the 3D display mode as illustrated in FIG. 5, as well as related depictions, and will not be set forth in details repeatedly here.

In this exemplary embodiment, a superior beneficial technical effect is provided in that, by means of the combination between the self-luminescent OLED display panel 1 and the LCD panel 2 which is provided with no color resistance layer, the OLED display panel 1 displays images in the 3D display mode while the LCD panel 2 functions as a light-splitting grating type functional panel for forming both left-eye and right-eye images respectively, and the LCD panel 2 displays images in the 2D display mode while the OLED display panel 1 functions as a backlight source module for providing backlight therefrom. In other words, in the 2D display mode, the LCD panel 2 is still used for displaying images with high PPI, thereby better display effect may still be obtained in the 2D display mode. Meanwhile, since the 2D/3D switchable display panel is not provided with specific purpose backlight source module, the light emitted from the OLED display panel 1 is provided at a relatively small distance from the LCD panel 2; thereby, the OLED display panel 1 displays images while the LCD panel 2 functions as a grating such that 3D image display with high quality may be realized. Furthermore, on the basis of the characteristics of the self-luminescent structure and low power consumption of the OLED display panel 1, it is thus not necessary to provide individually a specific purpose backlight source module, such that a decreased thickness and a reduced power consumption of the 2D/3D switchable display panel may be obtained.

Although the disclosure is described in view of the attached drawings, the embodiments disclosed in the drawings are only intended to illustrate the preferable embodiment of the present application exemplarily, and should not be deemed as a restriction thereof.

Various embodiments of the present application have been illustrated progressively, the same or similar parts of which can be referred to each other. The differences between each embodiment and the others are described in emphasis.

It should be noted that the terms, such as "comprising", "including" or "having", should be understood as not excluding other elements or steps and the word "a" or "an" should be understood as not excluding plural of said elements or steps. Further, any reference number in claims should be understood as not limiting the scope of the present application.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments of the general concept of the present application have been shown and described, it would be appreciated by those skilled in the art that various changes or modifications may be made in these embodiments without departing from the principles and spirit of the disclosure, the scope of which is defined in the claims and their equivalents.

What is claimed is:

1. A 2D/3D switchable display panel, comprising:
   an OLED display panel which is self-luminescent, and
   a LCD panel which is provided with no color resistance layer and disposed on a display side of the OLED display panel,
   wherein the OLED display panel is configured to display an image when the 2D/3D switchable display panel operates in a 3D display mode, and to act as a backlight source module when the 2D/3D switchable display panel operates in a 2D display mode;
   wherein the LCD display panel is configured to act as a grating when the 2D/3D switchable display panel operates in the 3D display mode, and to display an image when the 2D/3D switchable display panel operates in the 2D display mode; and
   wherein in the 2D display mode where the OLED display panel is configured to act as a backlight source module and the LCD panel is configured to display an image thereof, both the OLED display panel and the LCD panel are configured such that a refresh rate of the OLED display panel is set to be at least three times of a refresh rate of the LCD panel, and R, G, B color lights are emitted by the OLED display panel so as to be used as backlight for the LCD panel in different time periods respectively within a display duration of a frame of image, an emission duration for each of the R, G, B color lights corresponding to a refreshment duration of the LCD panel.

2. The 2D/3D switchable display panel according to claim 1,
   wherein the LCD panel comprises a color filter substrate, an array substrate and a liquid crystal layer provided between the color filter substrate and the array substrate, the color filter substrate and the array substrate and the liquid crystal layer being disposed to be cell aligned; and
   wherein the array substrate is provided with a pixel unit array for displaying images.

3. The 2D/3D switchable display panel according to claim 2,
   wherein the array substrate of the LCD panel is provided with a lower polarizer sheet at a side thereof facing away from the liquid crystal layer; and
   wherein the color filter substrate of the LCD panel is provided with an upper polarizer sheet at a side thereof facing away from the liquid crystal layer.

4. The 2D/3D switchable display panel according to claim 3, wherein the LCD panel further comprises a lenticular lens layer arranged at a side, facing away from the liquid crystal layer, of the color filter substrate.

5. The 2D/3D switchable display panel according to claim 1, wherein an area of a region occupied by each pixel on the OLED display panel is not only larger than but also an integral multiple of an area of a region occupied by each pixel on the LCD panel.

6. The 2D/3D switchable display panel according to claim 1, wherein a highest refresh rate of the OLED display panel is at least three times of a lowest refresh rate of the LCD panel.

7. The 2D/3D switchable display panel according to claim 2,
   wherein the OLED display panel comprises a display substrate and a packaging cover plate; and
   wherein an adhesive portion is interposed between the LCD panel and the OLED display panel, and the array substrate of the LCD panel is adhered to the cover plate by the adhesive portion.

8. The 2D/3D switchable display panel according to claim 2,
   wherein the OLED display panel only comprises a display substrate and a display component arranged on the display substrate, the display substrate defining a display zone around which an adhesive portion is provided at a periphery of the display substrate of the OLED display panel; and
   wherein the array substrate of the LCD panel is adhered to the display substrate of the OLED display panel by means of the adhesive portion.

9. A 2D/3D switchable display device, comprising the 2D/3D switchable display panel according to claim 1.

10. A display method for operating the 2D/3D switchable display panel according to claim 1, comprising steps of:
    operating the 2D/3D switchable display panel in the 3D display mode by configuring the OLED display panel to display an image thereon and configuring the LCD panel to act as a grating; and
    operating the 2D/3D switchable display panel in the 2D display mode by configuring the LCD panel to display an image thereon and configuring the OLED display panel to act as a backlight source module.

11. The display method according to claim 10, wherein the step of operating the 2D/3D switchable display panel in the 3D display mode by configuring the OLED display panel to display an image thereon and configuring the LCD panel to act as a grating comprises steps of:
    configuring the OLED display panel to display an image thereon; and
    configuring the LCD panel to display in a grating displaying mode and forming both a left-eye image and a right-eye image by passing the image displayed by the OLED display panel through the LCD panel such that the 2D/3D switchable display panel is operated in the 3D display mode.

12. The display method according to claim 10, wherein the LCD panel comprises a lenticular lens layer arranged at a side, facing away from the liquid crystal layer, of the color filter substrate, and the step of operating the 2D/3D switchable display panel in the 3D display mode by configuring the OLED display panel to display an image thereon and configuring the LCD panel to act as a grating comprises steps of:

configuring the OLED display panel to display an image thereon; and configuring the LCD panel to cooperate with the lenticular lens layer to display and forming both a left-eye image and a right-eye image by passing the image displayed by the OLED display panel through both of the LCD panel and the lenticular lens layer such that the 2D/3D switchable display panel is operated in the 3D display mode.

13. The display method according to claim 10, wherein the step of operating the 2D/3D switchable display panel in the 2D display mode by configuring the LCD panel to display an image thereon and configuring the OLED display panel to act as a backlight source module comprises steps of:

adjusting deflection angles of liquid crystal molecules in the liquid crystal layer of the LCD display panel at regions thereof which are occupied by the pixels of the LCD display respectively, based on grayscales of the R, G, B colors to be displayed by the pixels within the emission duration of each of the R, G, B color lights, so as to change respective light transmittance of the regions which are occupied by the pixels to accommodate display of grayscales of the R, G, B colors to be displayed so as to pass respective ones of the R, G, B color lights with desired grayscale therethrough and to display the R, G, B colors respectively thereon.

\* \* \* \* \*